(12) United States Patent
Wechsler et al.

(10) Patent No.: US 11,584,239 B2
(45) Date of Patent: Feb. 21, 2023

(54) RECEIVING DEVICE AND A METHOD OF MANUFACTURING A RECEIVING DEVICE

(71) Applicant: Bombardier Primove GmbH, Berlin (DE)

(72) Inventors: Simon Wechsler, Hirschberg (DE); Roman Gunt, Heidelberg (DE)

(73) Assignee: Bombardier Primove GmbH, Berlin (DE)

( * ) Notice: Subject to any disclaimer, the term of this patent is extended or adjusted under 35 U.S.C. 154(b) by 738 days.

(21) Appl. No.: 16/471,234

(22) PCT Filed: Jan. 24, 2018

(86) PCT No.: PCT/EP2018/051690
§ 371 (c)(1),
(2) Date: Jun. 19, 2019

(87) PCT Pub. No.: WO2018/138130
PCT Pub. Date: Aug. 2, 2018

(65) Prior Publication Data
US 2020/0259366 A1    Aug. 13, 2020

(30) Foreign Application Priority Data

Jan. 26, 2017   (GB) ..................... 1701317

(51) Int. Cl.
*B60L 53/12*    (2019.01)
*H02J 50/10*    (2016.01)
(Continued)

(52) U.S. Cl.
CPC ............ *B60L 53/12* (2019.02); *H01F 27/306* (2013.01); *H01F 27/36* (2013.01); *H02J 7/0042* (2013.01);
(Continued)

(58) Field of Classification Search
CPC ...... B60L 53/12; B60L 5/005; B60L 2200/18; B60L 2200/26; B60L 2200/36;
(Continued)

(56) References Cited

U.S. PATENT DOCUMENTS 8,760,253 B2 *   6/2014   Hickox ................... H01F 38/14
                                                       336/55
9,806,540 B2 *   10/2017  Anders .................. H05K 13/00
(Continued)

FOREIGN PATENT DOCUMENTS

CN    103117579 A    5/2013
GB    2512864 A    10/2014
(Continued)

*Primary Examiner* — Jared Fureman
*Assistant Examiner* — Michael J Warmflash
(74) *Attorney, Agent, or Firm* — The Webb Law Firm (57) ABSTRACT

A receiving device of a system for inductive power transfer includes a housing, which includes a cover element and a base element, at least one reception area for a circuit board, at least one magnetic shielding element, wherein the at least one magnetic shielding element covers the at least one reception area of the cover element at least partially, and a winding structure, the magnetic shielding element is arranged below the winding structure with respect to a vertical axis of the receiving device and the vertical axis of the receiving device is oriented orthogonal to an upper surface of the cover element and a bottom surface of the base element.

14 Claims, 6 Drawing Sheets

(51) Int. Cl.
  *H02J 50/70* (2016.01)
  *H05K 5/00* (2006.01)
  *H05K 9/00* (2006.01)
  *H01F 27/30* (2006.01)
  *H01F 27/36* (2006.01)
  *H05K 5/02* (2006.01)
  *H02J 7/00* (2006.01)

(52) U.S. Cl.
  CPC .............. *H02J 50/10* (2016.02); *H02J 50/70* (2016.02); *H05K 5/0052* (2013.01); *H05K 5/0247* (2013.01); *H05K 9/0052* (2013.01)

(58) Field of Classification Search
  CPC .... B60L 2200/42; H01F 27/306; H01F 27/36; H02J 50/10; H02J 50/70; H02J 7/0042; H02J 5/005; H05K 5/0052; H05K 5/0247; H05K 9/0052; Y02T 10/70; Y02T 10/7072; Y02T 90/14; B60Y 2200/11; B60Y 2200/14; B60Y 2200/15; B60Y 2200/30
  See application file for complete search history.

(56) References Cited

U.S. PATENT DOCUMENTS

| | | | |
|---|---|---|---|
| 2009/0267560 A1* | 10/2009 | Toya | H02J 50/70 320/108 |
| 2014/0159657 A1 | 6/2014 | Kim et al. | |
| 2015/0061583 A1 | 3/2015 | Nakamura et al. | |
| 2015/0077053 A1* | 3/2015 | Stamenic | H01F 27/363 320/109 |
| 2016/0049797 A1 | 2/2016 | Anders et al. | |
| 2016/0185226 A1 | 6/2016 | Garcia et al. | |
| 2017/0080815 A1 | 3/2017 | Wechsler et al. | |
| 2017/0253129 A1 | 9/2017 | Garcia et al. | |

FOREIGN PATENT DOCUMENTS

| | | | |
|---|---|---|---|
| GB | 2529630 A | 3/2016 | |
| KR | 20140008706 A | 1/2014 | |
| WO | 2013150365 A2 | 10/2013 | |
| WO | 2014166963 A1 | 10/2014 | |
| WO | WO-2014166963 A1 * | 10/2014 | .............. B60L 53/12 |
| WO | 2015150297 A2 | 10/2015 | |

\* cited by examiner

RECEIVING DEVICE AND A METHOD OF MANUFACTURING A RECEIVING DEVICE

CROSS-REFERENCE TO RELATED APPLICATIONS

This application is the United States national phase of International Application No. PCT/EP2018/051690 filed Jan. 24, 2018, and claims priority to United Kingdom Patent Application No. 1701317.8 filed Jan. 26, 2017, the disclosures of which are hereby incorporated by reference in their entirety.

BACKGROUND OF THE INVENTION

Field of the Invention

The present disclosure relates to a receiving device of a system for inductive power transfer and a method for manufacturing such a receiving device. More particularly, the present disclosure relates to a receiving device for receiving an electromagnetic field and for producing electric energy by magnetic induction, especially for use by a vehicle, in particular by an automobile. The present disclosure also relates to a method of manufacturing such a receiving device.

In particular, the technical application lies in the field of wireless transfer of energy to vehicles, such as road automobiles, busses, vans, trucks, but also load carriers, e.g. forklift trucks, and rail vehicles. The receiving device may be adapted to produce electric power at least at rates in the kilowatt range, e.g. 20 kW.

Technical Considerations

While travelling on a route, a vehicle requires energy for driving (i.e. propulsion) and for auxiliary equipment which does not produce propulsion of the vehicle. Such auxiliary equipment includes, for example, lighting systems, heating and/or air conditioning systems, ventilation and passenger information systems. Not only track-bound vehicles (such as trams), but also road automobiles can be operated using electric energy.

Vehicles, in particular electric vehicles, may be provided with energy in different manners. One option is to charge an energy storage on-board the vehicle while the vehicle stops and by using an electric cable connection. According to another option, the energy is transferred to the vehicle in a wireless manner using a magnetic field which induces an electric voltage in at least one inductance on-board the vehicle. The expression receiving device or pick-up has been used for the device which comprises at least one inductance.

The transfer of electric energy to the vehicle may be accomplished by induction. A route-sided conductor arrangement which can also be referred to as primary winding structure produces an electromagnetic field for power transfer. Said field is received by a vehicle-sided conductor arrangement, e.g. a secondary winding structure or coil, on-board of the vehicle so that the field produces an electric voltage by induction. The transferred energy may be used for propulsion of the vehicle and/or for other purposes such as providing the auxiliary equipment of the vehicle with energy. The vehicle may be, for example, a vehicle having an electrically operated drive motor. However, the vehicle may also be a vehicle having a hybrid drive system, e.g. a system which can be operated by electric energy or by other energy, such as energy provided using fuel (e.g. natural gas, diesel fuel, petrol or hydrogen).

SUMMARY OF THE INVENTION

There is a demand for the integration of a receiving device with a secondary winding structure in existing vehicles, such as road automobiles. The weight of the receiving device should be small, since the maximum revenue load of the vehicle should be affected as little as possible. In addition, the construction of the receiving device and the mounting of the receiving device should be stable and also easy to assemble. Existing spaces especially in the region of the bottom of the vehicle's car body, should be utilized.

Typically, the magnetic field (as part of an alternating electromagnetic field) is produced by a device below the vehicle's bottom. Therefore, the receiving device which is typically mounted at the bottom of the vehicle receives the magnetic field from below, i.e. from the bottom side. However, it is possible to orient the receiving device in a different direction (such as the horizontal direction) if the magnetic field generating device is located in this direction. Generally speaking, the receiving device has a receiving side and, during operation, the magnetic field enters the receiving device or the case on the receiving side.

WO 2014/166963 A1 discloses a receiving device for receiving a magnetic field and for producing electric energy by magnetic induction, wherein the receiving device comprises at least one coil of an electric line, wherein the magnetic field induces an electric voltage in the coil during operation and wherein the coil comprises an inductance, wherein the receiving device and the coil are adapted to receive the magnetic field from a receiving side, wherein the receiving device comprises a case enclosing the at least one coil and further components of the receiving device.

WO 2015/150297 A2 discloses a receiving device, in particular a receiving device of a system for inductive power transfer to a vehicle, wherein the receiving device comprises a housing, wherein at least one medium is arranged within the housing, wherein the medium has thermal coefficient of expansion which is smaller than the thermal coefficient of expansion of air.

In addition to the receiving winding structure, i.e. the secondary winding structure, the receiving device usually comprises further electric and electronic components. For instance, the receiving device can comprise a rectifier, wherein the rectifier can comprise power electronic elements. Further, the receiving device can comprise control and measurement elements. Further, the receiving device can comprise magnetically conductive elements, e.g. ferrite elements.

In addition to the receiving winding structure, these further components can also be arranged within a housing of the receiving device. In this case, the electromagnetic field for power transfer can interfere with the electric and electronic components which, in turn, can result in an undesired operational behaviour of the components.

There is the technical problem of providing a receiving device and a method of manufacturing a receiving device of a system for inductive power transfer which allow a space saving integration of electric and electronic elements into a housing of the receiving device while a reliability of an operation of the receiving device is ensured.

The solution to said technical problem is provided by the subject-matter of the present disclosure.

A receiving device of the system for inductive power transfer is proposed. The receiving device can be a receiving device for an automotive vehicle. The receiving device allows receiving an electromagnetic field for power transfer and providing electric power to the vehicle, in particular to a traction system of the vehicle.

The receiving device comprises a housing, wherein the housing comprises a cover element and a base element. Further, the cover element comprises at least one reception area for a circuit board, and in some non-limiting embodiments, two reception areas. The at least one reception area provides a receiving volume for the circuit board with an electric or electronic component. A reception area can be provided by a recess. Further, a reception area can be defined by fixation means for arranging and fixing a circuit board in the reception area. In this case, the reception area encloses a circuit board fixed by the fixation means.

The housing can have a rectangular, a hexagonal or an octagonal shape. The shape can be chosen according to an available installation space. A reception area can be arranged at an end section of the housing. If the cover element comprises two reception areas, these reception areas can be arranged at opposite end sections, in particular lateral end sections, of the housing.

The housing can be mounted to the vehicle. In particular, the housing can be mounted to the vehicle chassis, in particular to a front axle carrier. Further, the housing can be mounted to a bottom side or at the bottom side of the vehicle.

The housing can have at least one fixation means for mounting the housing to the vehicle. In some non-limiting embodiments, the cover element and/or the base element comprise at least one, and in some non-limiting embodiments, more than one, opening for receiving a screw. This allows to screw the housing and the vehicle together.

If the receiving device is mounted on the vehicle (mounted state), the cover element is arranged above the base element. The following coordinate system of the receiving device can be referred to in the following. A vertical axis of the receiving device is oriented orthogonal to an upper surface of the cover element and a bottom surface of the base element. A longitudinal axis of the receiving device can be oriented parallel to a longitudinal axis of the housing. A lateral axis of the receiving device can be oriented parallel to a lateral axis of the housing.

The vertical axis can also be oriented parallel to (a direction of) a gravitational force, in particular if the receiving device is mounted on the vehicle. An orientation of the vertical axis can be oriented opposite to the direction of the gravitational force. In this case, arranging a first element below a second element can mean that the second element follows behind the first element along the vertical axis.

If the receiving device is mounted on the vehicle, the vertical axis can be oriented parallel to a vertical axis or yaw axis of the vehicle. Further, the lateral axis of the receiving device can be oriented parallel to a lateral axis or pitch axis of the vehicle. Further, the longitudinal axis of the receiving device can be oriented parallel to a longitudinal axis or roll axis of the vehicle.

Directional terms such as "above", "below" can be understood with reference to the vertical axis. Directional terms such as "beside", "adjacent to" can be understood with reference to the longitudinal or lateral axis.

In a mounted state of the receiving device, the reception areas can thus be arranged at lateral end sections of the receiving device with respect to the vehicle. The housing and thus also the cover and base element can have a higher width along the lateral axis than a length along the longitudinal axis. In this case, end sections can denote sections at shorter face sides of the housing.

Further, the receiving device comprises at least one magnetic shielding element. The at least one magnetic shielding element can be designed as a magnetic shielding plate. A magnetic shielding element can denote an element with a low or no magnetic conductivity. In particular, the magnetic shielding element can be an aluminum element.

Further, the at least one magnetic shielding element covers the at least one reception area of the cover element at least partially, and in some non-limiting embodiments, fully. In particular, the at least one magnetic shielding element covers the at least one reception area of the cover element from below or from the receiving side of receiving device. In a mounted state, the magnetic shielding element can be arranged below the reception area.

The receiving device can comprise a winding structure for receiving the electromagnetic field. The winding structure can comprise a first sub-winding and at least another sub-winding. The first and the at least one other sub-winding of the winding structure are electrically connected.

The winding structure receives the main electromagnetic field and provides an induced output voltage. In this case, the first sub-winding receives a first portion of a main electromagnetic field and the at least one other sub-winding receives another portion of the main electromagnetic field if the winding structure is exposed to an electromagnetic field. Each sub-winding can provide a pole of the electromagnetic field generated by the induced current (induced electromagnetic field). In some non-limiting embodiments, the receiving device comprises means for guiding a magnetic flux in the receiving device. This means can e.g be provided by ferrite bars. Ferrite bars can be arranged above the secondary winding structure. By guiding the magnetic flux, an efficiency of the inductive power transfer can be increased. Also, a stray field is reduced which can be advantageous to meet certain regulations.

A sub-winding can comprise one or more section(s) of a phase line of the winding structure. The winding structure can comprise one or more phase lines for carrying an electric current. A sub-winding can enclose a predetermined area. Also, a sub-winding can provide or form a coil, e.g. with a predetermined number of turns.

The at least one phase line of the winding structure can be designed such that a course of the phase line provides an even or uneven number of sub-windings which are arranged adjacent to each other. In this context, a sub-winding can denote a conductor loop (e.g., a complete conductor loop) which encloses a predetermined area. The conductor loop can provide or comprise one turn or multiple turns of the respective sub-winding. Adjacent to each other means that central axes of the sub-windings, in particular the axes of symmetry, are spaced apart from one another, e.g. with the predetermined distance, along the common straight line. The common straight line can be parallel to a longitudinal axis of the receiving device. This means that a phase line of the winding structure can extend in a direction of extension, wherein a predetermined number of sub-windings is provided along said direction of extension.

Neighboring or adjacent sub-windings can be counter-oriented. In this context, counter-oriented can mean that a current flow in a first sub-winding is oriented clockwise, wherein the current flow in the neighboring or adjacent second sub-winding is oriented counter-clockwise. The clockwise direction can be defined with respect to the parallel central axes which point into the same direction. If a current flows through the set of sub-windings, adjacent sub-windings can generate a magnetic field of the same magnitude but oriented in opposite directions.

In some non-limiting embodiments, the winding structure can be 8-shaped. This can mean that a course of the at least one phase line is 8-shaped. In this case, the phase line can comprise two e.g. circular-shaped or rectangular-shaped sub-windings which are arranged adjacent to each other along the direction of extension according to the aforementioned explanation.

In some non-limiting embodiments, the winding structure comprises a first sub-winding and a second sub-winding. In this case, the winding structure can also be referred to as double D-winding structure.

The base element can comprise or has at least one reception area, e.g. a recess, for receiving the winding structure. The winding structure can be arranged in a center region of the base element. In a mounted state, the winding structure can thus be arranged adjacent to the reception area or at least one magnetic shielding element with respect to a lateral axis of the vehicle. If the receiving device, in particular the cover element comprises two reception areas and two magnetic shielding elements, the winding structure can be arranged in between the two reception areas or the two magnetic shielding elements in a mounted state of the receiving device.

Providing at least one magnetic shielding element which covers the at least one reception area of the cover element advantageously allows to shield elements arranged within said reception area from the electromagnetic field for power transfer which is generated by the primary winding structure. This reduces an interference of the electromagnetic field with said components and thus increases reliability of operation. Further, arranging the magnetic shielding element increases an electromagnetic compatibility of the receiving device since an electromagnetic field generated by electric or electronic components arranged within the reception area is shielded from the environment.

In some non-limiting embodiments, a thermal connecting element, e.g. a thermal pad, is arranged between components arranged in or on the base and the cover element in a closed state of the base element and cover element. Such a thermal connecting element can provide a thermal connection between components of the base element, e.g. the secondary winding structure or ferrite elements, and the cover element. Such a thermal pad can be a silicone-based thermal pad or a ceramic-based thermal pad.

In some non-limiting embodiments, a further thermal connecting element, e.g. a further thermal pad, is arranged between a circuit board and the cover element in the closed state of the base element and cover element. Such a further thermal connecting element can provide a thermal connection between components of the circuit board, e.g. heat generating components, and the cover element. Such a further thermal pad can be a non-conductive thermal pad. In particular, such a further thermal pad can be a ceramic-based thermal pad.

According to the invention, the receiving device comprises a winding structure, in particular a winding structure for receiving the electromagnetic field for power transfer.

The magnetic shielding element is arranged below the winding structure with respect to the vertical axis of the receiving device.

If the winding structure is arranged in or on the base element and in the mounted state, the cover element is arranged above the base element and the magnetic shielding element is arranged below the winding structure and below the cover element.

This advantageously further reduces installation space requirements.

In another embodiment, the shielding element has or provides at least one strap, wherein the at least one strap contacts the cover element. By the at least one strap, an electrical connection between the magnetic shielding element and the cover element can be provided. In particular, the strap can provide a grounding strap which electrically connects the magnetic shielding element to a ground potential provided by the cover element. In some non-limiting embodiments, the at least one strap also provides a mechanical connection between the magnetic shielding element and the cover element. This advantageously allows providing a ground connection for the shielding element.

The strap can be attached to the cover element. In particular, the strap can be screwed to the cover element. Of course, other ways of providing a mechanical connection between the cover element and the strap are possible.

In some non-limiting embodiments, the cover element has at least one projecting portion or provides such a projecting portion. Such a projecting portion can extend from an edge region, in particular a lateral edge region, of the cover element. In the projecting portion of the cover element, a thread section can be arranged or provided. A strap can have a through-hole. In some non-limiting embodiments, the strap and the cover element may be connected by a screw, wherein an electrical and mechanical connection between the cover element and the shielding element is provided. The screw can extend through the through-hole of the strap into the thread section.

In the mounted state, the cover element can be connected to a reference potential, e.g. a ground potential, of the vehicle. In this case, the magnetic shielding element is also electrically connected to the reference potential of the vehicle.

In some non-limiting embodiments, the at least one strap extends through a side wall of the housing and/or extends from an edge region of the shielding element. In particular, the at least one strap extends through an opening in the side wall provided by the cover element. The housing, in particular the cover element, can be connected to ground potential of the vehicle in the mounted state.

In another embodiment, a circuit board is arranged within the reception area, wherein the contour of the magnetic shielding element fully encloses a contour of the circuit board in a common plane of projection or encloses the contour of the circuit board by more than a predetermined non-zero percentage but not fully in the common plane of projection. In some non-limiting embodiments, the predetermined non-zero percentage can be 50%, 75%, or 90%.

If the contour of the magnetic shielding element fully encloses a contour of the circuit board, the magnetic shielding element can fully cover the circuit board from below. In some non-limiting embodiments, the magnetic shielding element may not fully cover the circuit board from below. In particular, the magnetic shielding element can have at least one recess or through-hole, in particular in a central region of the magnetic shielding element. The at least one recess or through-hole can be arranged such that a desired signal transmission power and/or signal receiving power for at least one signal transmitter and/or signal receiver means on or of the circuit board is provided. In some non-limiting embodiments, the at least one recess or through-hole is arranged directly below the signal transmitter and/or signal receiver means on the circuit board along the vertical axis.

If the contour of the magnetic shielding element encloses the contour of the circuit board by more than a predetermined non-zero percentage, the magnetic shielding element can cover the circuit board from below partially. In particular, the magnetic shielding element can have at least one recess or indentation in an edge region of the magnetic shielding element. Such a recess can be arranged such that a desired signal transmission power and/or signal receiving power for at least one signal transmitter and/or signal receiver means on or of the circuit board is provided. In some non-limiting embodiments, the at least one recess or indentation is arranged directly below the signal transmitter and/or signal receiver means on the circuit board along the vertical axis. In some non-limiting embodiments, the magnetic shielding element has at least one further recess or through-hole in a center region of the magnetic shielding element if the contour of the magnetic shielding element encloses the contour of the circuit board by more than a predetermined non-zero percentage.

The circuit board can comprise electric or electronic components which can be installed on the circuit board. In this case, the receiving device can comprise the circuit board. The circuit board can be attached to the cover element. In particular, the circuit board can be screwed to the cover element. In this case, a circuit board can have at least one recess or through-hole through which a screw can extend.

A fixation means, in particular the screw, for mechanically connecting the circuit board to the cover element can also provide an electrical connection of the circuit board to the cover element. This advantageously allows to ground the circuit board.

That the contour of the shielding element fully encloses the contour circuit board can mean that in a common plane of projection which is oriented orthogonal to the vertical axis of the receiving device, an area of the shielding element or a portion thereof overlaps the complete area of the circuit board. That the contour of the shielding element encloses the contour of the circuit board by more than a predetermined non-zero percentage but not fully can mean that in said common plane of projection, an area of the shielding element does not overlap the complete area of the circuit board.

In some non-limiting embodiments, the receiving device comprises two circuit boards. A first circuit board can also be referred to as low voltage circuit board, wherein a second circuit board can be referred to as high voltage circuit board. The low voltage circuit board can comprise electric and electronic components which are operated with a maximum voltage of 12 V or 42 V. Thus, the low voltage circuit board can comprise electric and electronic components for controlling an operation of the receiving device and for establishing a signal and or data connection to the vehicle. In contrast, the high voltage circuit board can comprise electric or electronic components with a maximal operating voltage up to 1200 V. In particular, the high voltage circuit board can comprise electric and electronic components for converting and filtering the power signal, in particular the output voltage/current of the winding structure. These components can also be referred to as power electric components. Such components comprise e.g. diodes, electric switching elements such as MOSFET or IGBT, capacitors and so on.

In this case, the receiving device can comprise two magnetic shielding elements, wherein a first circuit board is arranged within a first reception area of the cover element and the first shielding element covers the first reception area at least partially, and in some non-limiting embodiments, fully. A second circuit board is arranged within a second reception area of the cover element, wherein the second shielding element covers the second reception area at least partially, and in some non-limiting embodiments, fully. This advantageously allows the reduction of an interference of the electromagnetic field for power transfer with the components of a circuit board which, in turn, ensures a reliable operation of the receiving device.

In particular, the contour of the shielding element corresponds to a scaled contour of the circuit board, wherein a scaling factor is higher than or equal to one. The contour of the shielding element can denote a contour without the aforementioned strap. This can mean that dimensions of the shielding element are larger than corresponding dimensions of the circuit board. If the circuit board as e.g. a rectangular shape, the shielding element can also have a rectangular shape, wherein a length of shielding element can be higher than or equal to the length of the circuit board and a width of the shielding element can be higher than or equal to the width of the circuit board. It is, however, not mandatory that the circuit board and the shielding element have a rectangular shape. Other geometrical shapes, in particular freeform shapes can be chosen.

This advantageously provides an efficient shielding of the circuit board.

In another embodiment, the magnetic shielding element has at least one recess, wherein the at least one recess is provided by a concave section of the contour, in particular the contour of the magnetic shielding element. The concave section provides a volume through which a fixation means for attaching the base element to the cover element can extend. The fixation means can be a screw. In this case, the circuit board can also have at least one recess, wherein the at least one recess of the circuit board is provided by concave section of the circuit board.

This advantageously allows an integration of the magnetic shielding element into the housing with minimized installation space requirements.

In another embodiment, the cover element comprises a first reception area and at least one further reception area, wherein a further circuit board is arranged in the first reception area and a further circuit board is arranged in the further reception area. Further, the receiving device comprises at least one connecting means for providing a signal connection between the first and the further circuit board. The signal connection means can be provided by or be a cable.

In particular, the signal connection means can be a flat ribbon cable or a flexible printed circuit board. Further, at least one section of the signal connecting means is arranged in a guiding channel of the cover element. This means that the cover element has or provides at least one guiding channel. The guiding channel can be provided by a recess in the cover element wherein said recess connects the first and the further reception area for receiving circuit boards. The guiding channel can also be provided by a reception slot in the cover element.

This advantageously further reduces installation space requirements for the receiving device.

In some non-limiting embodiments, the magnetic shielding element is oriented orthogonal to a main direction of the field lines of the electromagnetic field receivable by the winding structure. The main direction of field lines can be parallel to the vertical axis of the receiving device and, in a mounted state, parallel to a vertical axis or yaw axis of the vehicle. This advantageously provides an effective shielding of components arranged within the reception area from the electromagnetic field.

In another embodiment, the shielding element is made of aluminum. This advantageously reduces a weight of the receiving device while desired shielding properties are provided.

In another embodiment, a thickness of the magnetic shielding element depends on a frequency of the electromagnetic field receivable by the winding structure. In some non-limiting embodiments, a frequency of 85 kHz may be used as an operating frequency of the electromagnetic field. In this case, the thickness can be chosen in the range from 0.5 mm to 1.0 mm. In one example, the thickness of the magnetic shielding element is 0.7 mm. This allows an effective shielding, wherein installation space requirements, in particular a height of the receiving device, are reduced.

In another embodiment, the magnetic shielding element is attached to the bottom element. In particular, the shielding element can be arranged in a recess on a bottom side of the bottom element.

In another embodiment, the cover element has at least one alignment projection for aligning the circuit board. The alignment projection can be a projection on an inner section of the cover element. In this case, the circuit board can have one recess or through-hole through which the alignment projection can extend in aligned state of the circuit board. This advantageously reduces an installation, in particular an alignment, effort.

In another embodiment, the alignment projection has a thread. In this case, the screw can be used to mount the circuit board to the cover element. The screw can extend through the recess or through-hole in the circuit board into the thread provided by the alignment projection.

Further proposed is a method of manufacturing a receiving device of a system for inductive power transfer. First, a cover element and a base element of a housing of the receiving device are provided, wherein the cover element comprises at least one reception area. Further at least one magnetic shielding element is provided.

Further, the at least one magnetic shielding element is arranged in the housing such that it covers the at least one reception area of the cover element at least partially, and in some non-limiting embodiments, fully.

The method advantageously allows manufacturing the receiving device according to one of the embodiments described in this disclosure.

The at least one magnetic shielding element can be attached to the cover element, and in some non-limiting embodiments, to the base element. In particular, the shielding element can be glued to the base element. If the base element is attached to the cover element, which can also be referred to as closed state, the magnetic shielding element can cover the reception area in the cover element.

Further discloses is a vehicle, wherein the vehicle can comprise a receiving device according to one of the embodiments described in this disclosure. The receiving device can be mounted to the vehicle, in particular to a bottom side of the vehicle.

The receiving device can be connected to a communication system of the vehicle, in particular a bus system in order to provide a signal and/or data connection. Further, the receiving device can be electrically connected to an electric system of the vehicle, in particular a traction system. Electric energy provided by induction can thus be transferred to the vehicle.

BRIEF DESCRIPTION OF THE DRAWINGS

The invention will be described with reference to the attached figures. The attached figures show.

DESCRIPTION OF THE INVENTION

In the following, same reference numerals denote elements with the same technical aspects or features.

Figure 1:
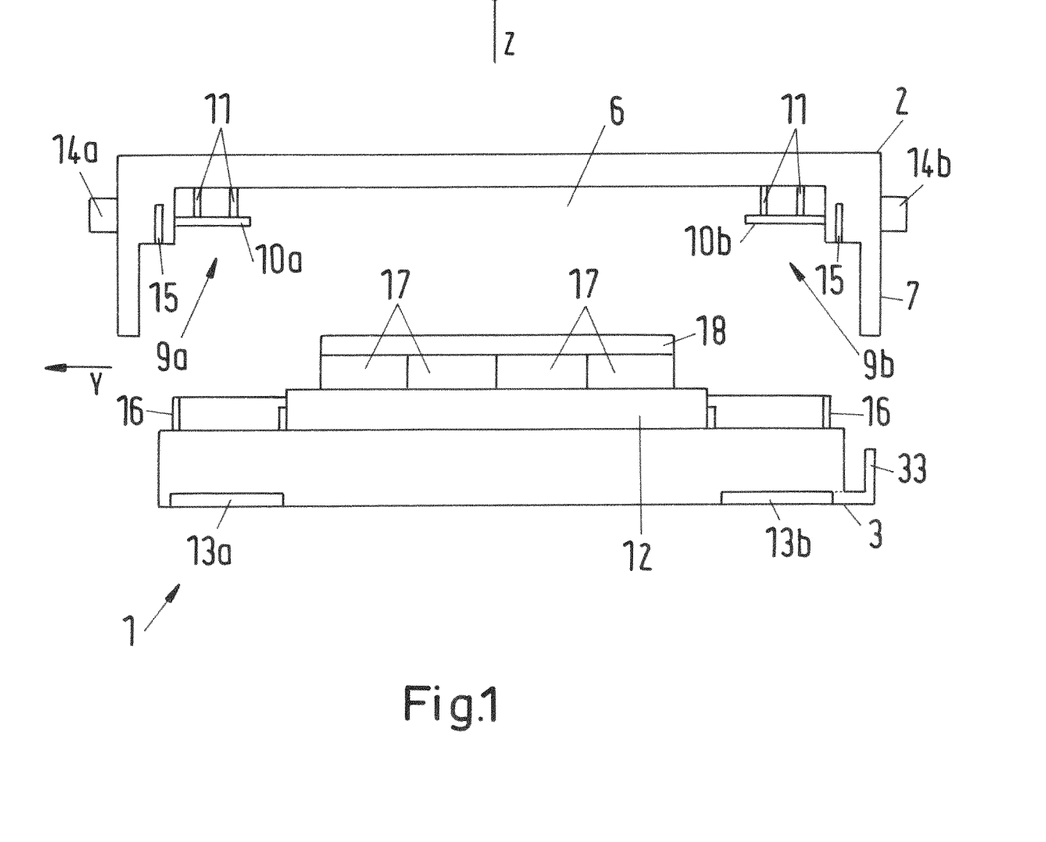
FIG. 1 a schematic cross section of a receiving device according to the invention, FIG. 2 a schematic cross section of a cover element, FIG. 3 a schematic top view on a cover element, FIG. 4 a schematic bottom view of a cover element, FIG. 5 a schematic top view on a bottom element, FIG. 6 a schematic longitudinal section of a bottom element, FIG. 7 a schematic top view on a cover element in another embodiment, FIG. 8 a detailed view of a schematic cross-section of a cover element in another embodiment.

FIG. 1 shows a schematic cross section of a receiving device 1 of a system for inductive power transfer. The receiving device 1 comprises a housing, wherein the housing comprises a cover element 2 and a base element 3. The cover element 2 is made of aluminum. The base element 3 is made of plastic, in particular of fibre-reinforced plastic. A material of the base element 3, in particular the fibre-reinforced plastic, can have a coefficient of thermal expansion which is equal to the coefficient of thermal expansion of the material of the cover element 2 or does not deviate more than a predetermined amount from said coefficient.

The base element 3 can be attached to the cover element 2 to provide a closed state of the housing or receiving device 1. In particular, the base element 3 can be screwed and/or glued to the cover element 2. To provide such a screwing connection, the base element 3 can have through-holes 4, 29 (see FIG. 5) and the cover element 2 can have corresponding threaded sections 5, 27 (see FIG. 2).

In the closed state, the base element 3 is fully arranged in an inner volume 6 provided by the cover element 2. Side walls 7 of the cover element 2 enclose sides of the base element 3.

The receiving device 1 can be mounted to a vehicle (not shown). In particular, the receiving device 1 can be screwed to the vehicle, in particular to a front axle carrier of the vehicle. To provide such a screwing connection, the base element 3 and the cover element 2 can have corresponding through-holes 8a, 8b (see FIG. 5 and FIG. 3), wherein a screw can extend through the corresponding through-holes 8a, 8b of the cover and base element 2, 3 in the closed state. Further, screw can extend into a thread section of the vehicle. Alternatively, the cover element 2 can be screwed to the vehicle, e.g. to the front axle carrier of the vehicle. Further, the base element 3 can be attached, in particular screwed, to the cover element 2.

Figure 3:
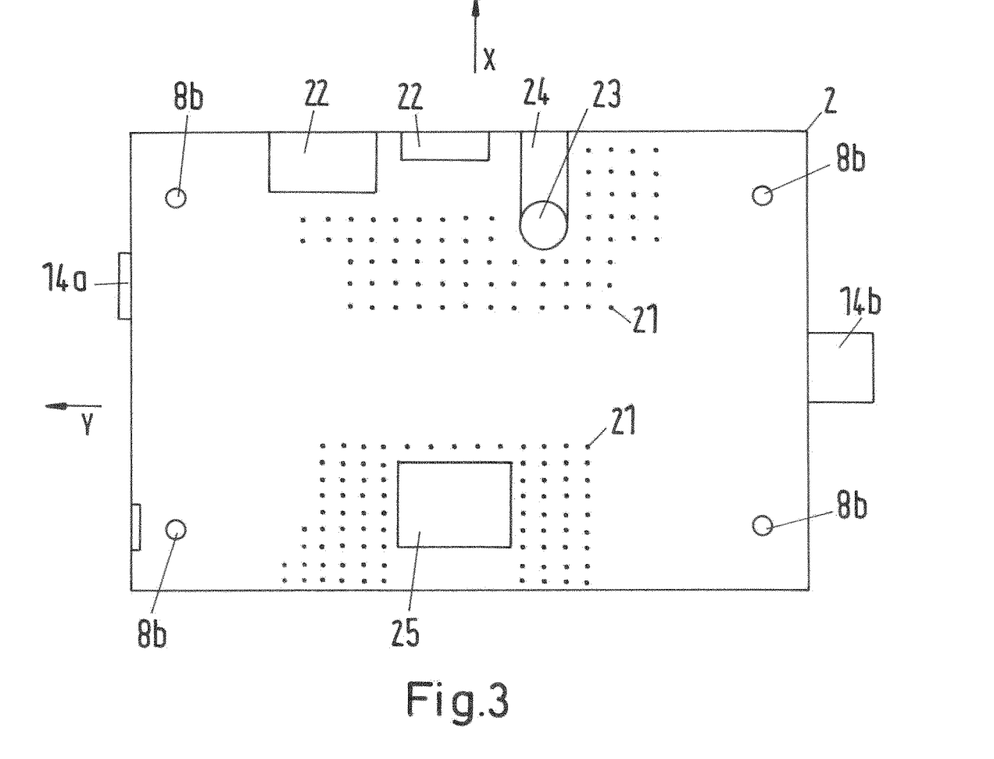

Further shown is that the receiving device 1, in particular the cover element 2, has a first reception area 9a and a second reception area 9b. The reception areas 9a, 9b are portions of an inner volume of the housing in the closed state. In the following, the following reference coordinate system will be referred to. A vertical axis z can be oriented perpendicular to a flat upper surface of the cover element 2 or to a flat bottom surface of the base element 3. If the receiving device 1 is mounted to the vehicle (mounted state), the vertical axis z can be oriented parallel to a yaw axis of the vehicle. Further, the vertical direction can be oriented parallel to a main direction of inductive power transfer. Further shown is a lateral axis y, wherein the lateral axis y is oriented perpendicular to the vertical axis z. In the mounted state, the lateral axis y can be oriented parallel to a pitch axis of the vehicle. FIG. 3 shows a longitudinal axis x. The longitudinal axis x is oriented perpendicular to the vertical and lateral axis z, y, respectively. In the mounted state, the longitudinal axis x can be oriented parallel to the roll axis of the vehicle. Further, the longitudinal axis x can be oriented opposite to the driving direction of the vehicle if the vehicle travels straight forward. The vertical, lateral and longitudinal directions are each indicate with an arrowhead.

In the mounted state of the receiving device 1, the cover element 2 is mounted on the base element 3.

It is shown that the first reception area 9a is arranged in a first lateral peripheral area of the receiving device 1, in particular of the cover element 2. The second reception area 9b is provided in a second lateral peripheral area. The peripheral areas are arranged on opposite sides of the receiving device 1 with respect to the lateral axis y.

A reception area 9a, 9b can be provided by a recess in the receiving device 1, in particular of the cover element 2. Alternatively, or in addition, a reception area 9a, 9b can be defined by attachment means for attaching a circuit board 10a, 10b to the receiving device 1, in particular to the cover element 2.

Further shown is that the receiving device 1 comprises a first circuit board 10a and a second circuit board 10b. The first circuit board 10a is arranged in the first reception area 9a. Further, the first circuit board 10a is attached to the cover element 2. Further, the second circuit board 10b is arranged in the second reception area 9b. Further, the second circuit board 10b is attached to the cover element 2. In particular, the circuit boards 10a, 10b can be screwed to the cover element 2. To provide such a screwing connection, screws 11 can extend through through-holes of the circuit boards 10a, 10b (not shown) into thread sections of the cover element 2. The mechanical connection between the circuit boards 10a, 10b and the cover element 2 can also provide an electrical connection between the circuit boards 10a, 10b, and the cover element 2, in particular for providing a grounding of the circuit boards 10a, 10b.

In some non-limiting embodiments, the cover element 2 is electrically connected to a reference potential, e.g. a ground potential, of the vehicle. In this case, the electrical connection between the circuit boards 10a, 10b, and the cover element 2 also provides an electrical connection of said circuit boards 10a, 10b to the reference potential. The electrical connection between the cover element 2 and the reference potential of the vehicle can be provided by the mechanical connection between the receiving device 1 and the vehicle, in particular, by the screws for mounting the receiving device 1 to the vehicle.

In the closed state of the housing or in the mounted state of the receiving device 1, the reception areas 9a, 9b are arranged beside a winding structure 12 for receiving the alternating electromagnetic field for power transfer with respect to the lateral direction. The winding structure 12 is arranged in a central region of the inner volume of the housing in the closed state.

Further shown is that the receiving device 1 comprises a first magnetic shielding element 13a and a second magnetic shielding element 13b. A magnetic shielding element denotes an element which shields from a magnetic field. The magnetic shielding elements 13a, 13b can be designed as aluminum plates. Further, the magnetic shielding elements 13a, 13b are attached to the base element 3. In particular, the magnetic shielding elements 13a, 13b are arranged in recesses provided at a bottom surface of the base element 3. Further, a bottom side of the magnetic shielding elements 13, 13b can be aligned with a bottom side of the base element 3. The first magnetic shielding element 13a fully covers the first reception area 9a from below. In other words, the first magnetic shielding element 13a is arranged below the first reception area 9a with respect to the vertical direction. Further, the first magnetic shielding element 13a is arranged such that the first reception area 9a, in particular the first circuit board 10a arranged in the first reception area 9a, is fully shielded from an electromagnetic field from below. As a result, the amount of magnetic field lines which extend through the reception areas 9a, 9b if an alternating magnetic field for power transfer is provided will be minimized or even reduced to zero. The magnetic shielding elements 13a, 13b are arranged such that an interference of electric and/or electronic elements, in particular of elements of the circuit boards 10a, 10b with the electromagnetic field for power transfer are minimized.

The first circuit board 10a can also be referred to as low voltage circuit board. This can mean that electric and electronic components of the first circuit board 10a are supplied with a maximal voltage of 12 V or 42 V or provide such a voltage. The second circuit board 10b can also be referred to as high voltage circuit board. This can mean that electric and electronic components of the second circuit board 10b can be provided with or can generate electric voltages with a maximal voltage of up to 1200 V. Components of the first circuit board 10A can provide control means for controlling an operation of the receiving device 1 and communication means for providing a communication with the vehicle and/or a primary unit. Components of the second circuit board 10b provide a desired DC (direct current) output voltage of the receiving device 1 from the voltage induced in the winding structure 12 by the electromagnetic field for power transfer.

Further shown is a first connector 14a by which a signal and or data connection to components of the first circuit board 10a can be provided. The first connector 14a can be designed as CAN connector. At least a part of first connector 14a is arranged at an outer surface of a side wall of the cover element 2. Further shown is a second connector 14b which can also be referred to as power connector or DC interface. By the second connector 14b, a power and if applicable a signal connection between the components of the second circuit board 10b and the vehicle can be provided. The second connector 14b is also arranged at an outer surface of a side wall of the cover element 2. The second connector 14b can be a connector with a cable gland as to provide a sealing of the inner volume of the housing in the closed state.

Further shown is a groove 15 of a tongue and groove connection. The groove 15 is provided in a peripheral section of the cover element 2. In particular, the groove 15 is an all-round groove which can also be referred to as circumference groove. The groove 15 allows receiving a sealing element, in particular an all-round sealing element (not shown).

The cover element 3 has a corresponding tongue 16 of the groove and tongue connection. The tongue 16 is arranged in a peripheral section of the base element 3 and on an upper surface of the base element 3. In particular, the tongue 16 is provided by a bar protruding from upper surface of the base element 3.

In the closed state of the housing, the tongue 16 extends into the groove 15 and jams the sealing element in the groove 15. In this way, a robust and reliable sealing of the inner volume of the housing in which the circuit boards 10a, 10b and the winding structure 12 is arranged can be provided. The tongue 16 can also be designed as an all-round or circumferential tongue 16.

Further shown are ferrite bars 17 which are part of a ferrite arrangement and provide magnetically conducting elements. Shown is that the ferrite bars 17 are arranged on and above the winding structure 12, in particular above a central section of the winding structure 12. The ferrite bars 17 and the winding structure 12 can be attached to the base element 3. In particular, the winding structure 12 and the ferrite bars 17 can be casted with the base element 3. The ferrite bars 17 are arranged such that a desired course of field lines of the magnetic field is provided.

In some non-limiting embodiments, upper ferrite bars 17b (see FIG. 6) are not fully casted or enclosed by casting material. This advantageously provides a defined height of the arrangement of ferrite bars 17, 17a, 17b as no height deviation is due to casting material arises. In some non-limiting embodiments, lower ferrite bars 17a as well as a connecting section between the upper and lower ferrite bars 17a, 17b is fully casted.

In some non-limiting embodiments, a tape is provided on an upper side of the upper ferrite bars 17b in order to attach the upper ferrite bars 17b to the lower ferrite bars 17a or to the base element 3. This advantageously prevents the upper ferrite bars 17b from splintering due to vibrations.

Further shown is a thermal pad 18 which provides a thermally conductive element. The thermal pad 18 is arranged above the ferrite bars 17, in particular above the upper ferrite bars 17b. The thermal pad 18 can have a high thermal conductivity. In the closed state of the housing, the thermal pad 18 mechanically contacts an inner wall section and the ferrite bars 17 and thus provides a thermal connection between the ferrite bars 17 and the cover element 2. Such a thermal pad can comprise silicone.

Further, the thermal pad 18 can provide an adhesive element. For example, the thermal pad 18 is designed as a double-sided adhesive element or a one-sided adhesive element. The thermal pad 18 can thus be used to secure a ribbon cable 36 in a reception slot 37 of the cover element 2 (see FIG. 4).

In some non-limiting embodiments, the receiving device 1 can comprise at least one thermally conductive element, wherein the thermally conductive element provides a thermal connection between cover element 2 and the winding structure 12 or the ferrite arrangement in a closed state of the housing. In particular, the thermally conductive element can mechanically contact the cover element 2 and the winding structure 12 or the ferrite arrangement.

Figure 2:
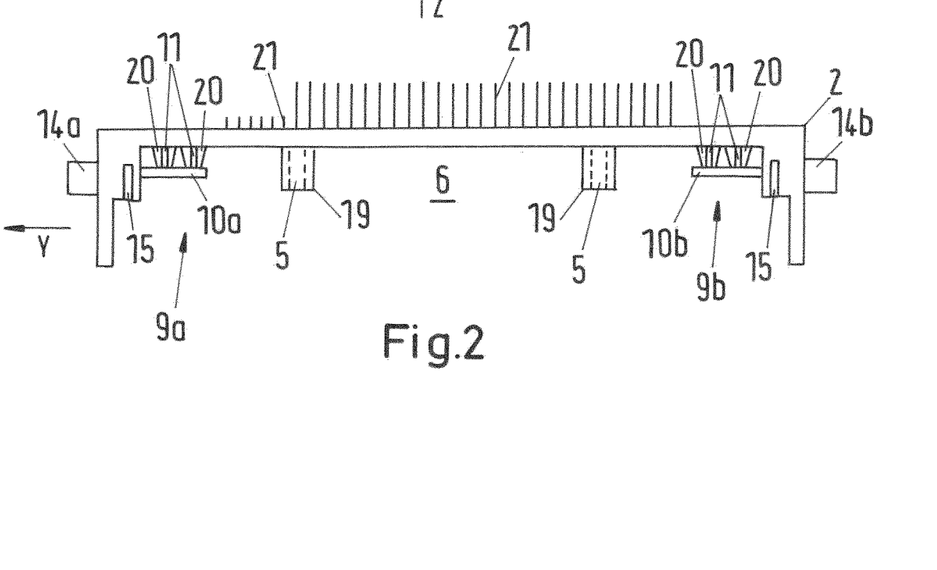

FIG. 2 shows schematic cross section of a cover element 2. Shown are the circuit boards 10a, 10b which are attached to the cover element 2 by the means of screws 11. Also shown is the groove 15 of a groove and tongue connection. Further shown are cylindrical protrusions 19 on a bottom surface of the cover element 2 which each provide a thread 5 for receiving the screws for mounting the base element 3 to the cover element 2.

Further shown are conical protrusions 20 of the cover element 2, in particular on the bottom surface of the cover element 2 which extend into the inner volume 6 of the cover element 2 and which provide threads for the screws 11 for mounting the circuit boards 10, 10b to the cover element 2. These conical or cone-shaped protrusions 20 are arranged in the reception areas 9a, 9b and extend through through-holes in the circuit boards 10a, 10b (not shown). This advantageously allows aligning the circuit boards 10a, 10b in the respective reception area 9a, 9b. Further shown are cooling pins 21 which are mounted on an upper surface of the cover element 2.

The cooling pins 21 can have different length. The length can be chosen according to installation space conditions.

The cooling pins 21 are arranged in a central region of the cover element 2. In particular, the cooling pins 21 are arranged outside a volume above the reception areas 9a, 9b or the circuit boards 10a, 10b. The cooling pins 21 allow a transfer of thermal energy from the cover element 2 to an environment by the means of convection.

FIG. 3 shows a schematic top view on a cover element 2. Shown are the through-holes 8b for receiving screws to mount the receiving device 1 to the vehicle. Further shown are cooling pins 21 which extend from an upper surface of the cover element 2. Further shown are recesses 22 on the upper surface of the cover element 2. Theses recesses 22 decrease the inner volume of the housing in the closed state of the housing. In particular, the recesses 22 decrease the amount of air within the inner volume of the receiving device 1. This, in turn, decreases a pressure variation of the pressure within the inner volume due to temperature changes. In some non-limiting embodiments, the temperature within the receiving device 1 varies between −40° C. to 120° C. The temperature variation may be a function of an outside temperature change and thermal energy generated by electric and electronic components within the inner volume, in particular components of the second circuit board 10b.

These temperature changes may result in a pressure change of the pressure in the inner volume. Reducing the inner volume advantageously allows reducing a magnitude of the pressure change.

Further shown is a first membrane element 23. The first membrane element 23 is designed as a semipermeable, vapor permeable element. In particular, the vapor permeable membrane element 23 advantageously allows vapor to exit from the inner volume of the receiving device 1 in closed state of the housing through the first membrane element 23. The first membrane element 23 extends through the cover element 2. On the upper surface of the cover element 2, the membrane element 23 is arranged in an inclined groove 24 for water drain.

Further shown is a second membrane element 25. The second membrane element 25 is provided by a flexible, non-permeable, in particular a vapor-nonpermeable, material, e.g. an elastomer, in particular by silicone, thermoplastic elastomere(s) or other kind of plastics like EPDM (ethylene propylene dien) or polyvinyl chloride.

The second membrane element 25 advantageously allows a change of volume of the inner volume of the receiving device 1 in the closed state of the housing. Due to the previously described temperature changes, a pressure in the inner volume can exceed a maximal admissible pressure. The second membrane element 25 can be designed such that it deforms if a pressure higher than a predetermined pressure is applied on the second membrane element 25.

In particular, in the case where the first membrane element 23 does not allow a vapor diffusion from the inner volume of the housing to an environment, the second membrane element 25 allows to keep the pressure inside the inner volume within an admissible range by deforming. In some non-limiting embodiments, vapor diffusion may not be possible if the first membrane element 23 is covered by water, e.g. if the vehicle travels through a deep puddle.

Figure 4:
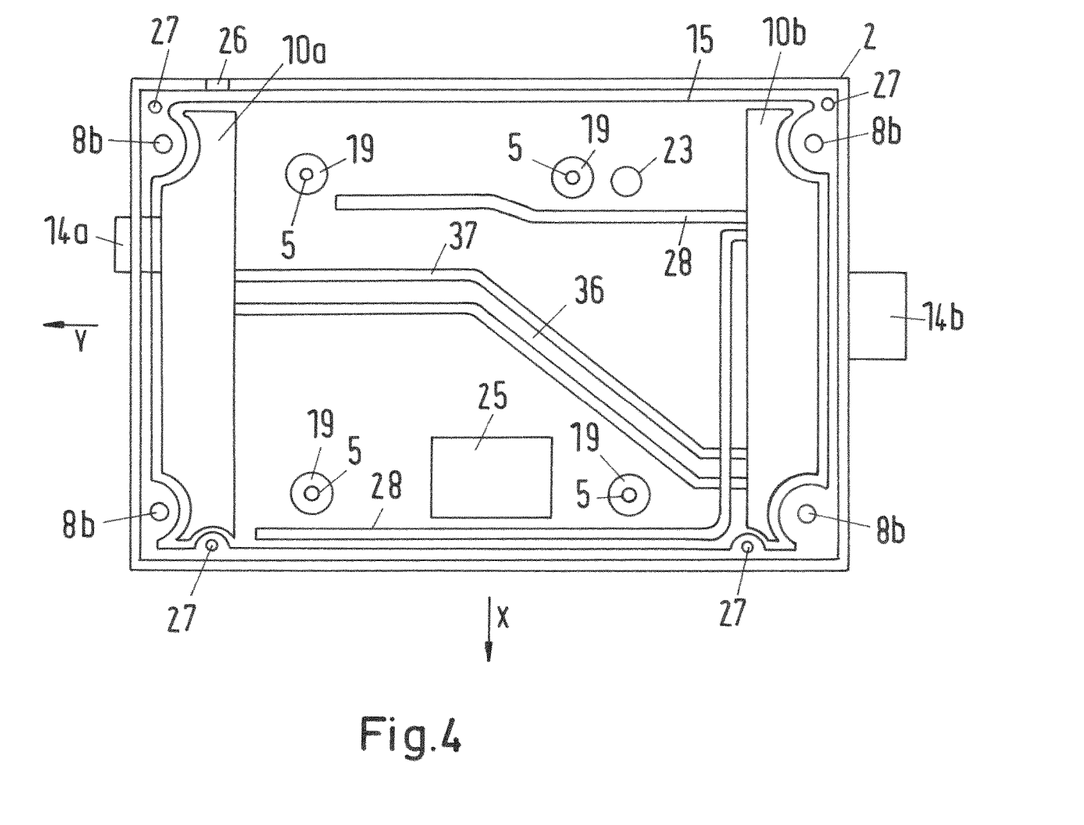

FIG. 4 shows a schematic bottom view of a cover element 2. Shown are the circuit boards 10a, 10b. A border section of the cover element 2, in particular a border section which encloses the first circuit board 10a has a groove 26 for receiving a strap 32 (see FIG. 5) of the first magnetic shielding element 13a. The strap 32 connects the first magnetic shielding element 13a to the cover element 2 and thus provides an electrical connection between the first magnetic shielding element 13a and thus to a reference potential of the vehicle.

Further shown are the cylindrical protrusions 19 with the thread sections 5. Further shown are the first and the second membrane element 23, 25. Further shown are thread sections 27 in the cover element 2 which allow screwing the base element 3 to the cover element 2. Further indicated is the groove 15 of the groove and tongue connection which circumferes the circuit boards 10a, 10b and a central section of the cover element 2.

Further shown is a reception slot 37 for receiving a ribbon cable 36. The ribbon cable 36 provides a data and signal connection between components of the circuit board 10a and components of the second circuit board 10b. The ribbon cable 36 can be secured in the reception slot 37 by means of adhesive elements. In some non-limiting embodiments, these adhesive elements are provided by thermal pads 18 (see. FIG. 1).

Instead of the ribbon cable 36a, a flexible printed circuit board can be used to provide the data and signal connection. The flexible printed circuit board can be adhesive on one side. In some non-limiting embodiments, the cover element 2 may not have a reception slot 37.

Furthermore, a course of the reception slot 37 shown in FIG. 4 and a ribbon cable 37 arranged therein or of the flexible printed circuit board can be different from the embodiment shown in FIG. 4. FIG. 4 shows that the reception slot 37 extends through an area in which ferrite bars 17 (see FIG. 1) or a thermal pad 18 lie flat on the cover element 2. In some non-limiting embodiments the reception slot 37, a ribbon cable 36 arranged therein, and/or a flexible printed circuit board, may be arranged such that they extend around the area in which ferrite bars 17 (see FIG. 1) or a thermal pad 18 lie flat on the cover element 2.

Further shown are heat pipes 28, wherein the heat pipes 28 extend from the second circuit board 10b into the central region of the cover element 2. In particular, the heat pipes 28 extend from the second circuit board 10b into a region below the cooling pins 21 (see FIG. 2 and FIG. 3). The heat pipes 28 allow a transfer of thermal energy from the second circuit board 10b, in particular from heat generating components of the second circuit board 10b such as power electronic components, into the central region. This, in turn, allows to distribute thermal energy within the receiving device 1 which advantageously reduces a thermal stress of the second circuit board 10b and components thereof.

The heat pipes 28 can be arranged within grooves of the cover element 2, in particular grooves in an inner wall section of the cover element 2.

Alternatively or in addition, at least one thermal pad (not shown) can be attached to the first circuit board 10a and/or to the second circuit board 10b. The thermal pad can be arranged such that a thermal connection between components, in particular heat generating components such as capacitors and/or power electronic components, of the respective circuit board 10a, 10b and the cover element 2 is provided. Such a thermal pad can be arranged between a surface of the circuit board and the cover element 2, in particular an inner wall section of the cover element 2. Such a thermal pad can have a high thermal conductivity. The thermal pad can thus provide a thermal connection between the respective circuit board and the cover element 2. Such a thermal pad can be provided by a ceramic thermal pad, in particular a thermal pad comprising aluminium nitrite.

Figure 5:
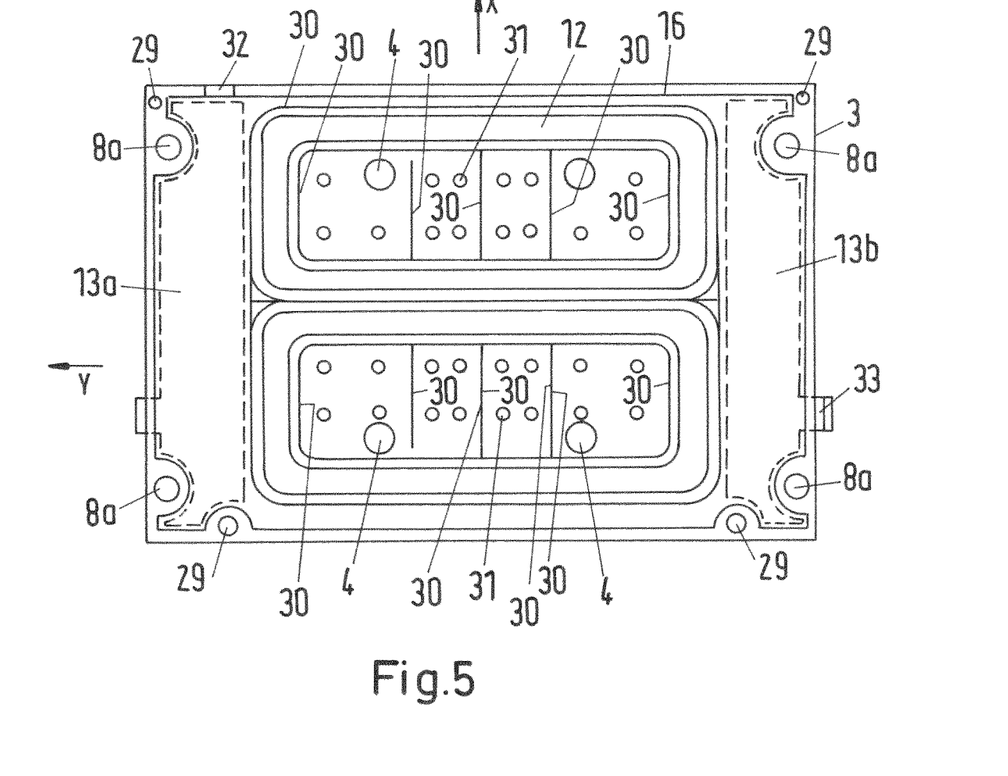

FIG. 5 shows a schematic top view on a base element 3. Shown are the through-holes 4 and further through-holes 29 for providing a screwing connection between the base element 3 and the cover element 2. Further shown are the through-holes 8a for providing the screwing connection of the receiving device 1 to the vehicle. Indicated is the tongue 16 of the groove and tongue connection. Further indicated are the magnetic shielding elements 13a, 13b.

Further shown are bars 30 protruding from an upper surface of the base element 3. These bars 30 enclose a reception area for the winding structure 12 and for ferrite bars 17 (see FIG. 1) and thus define said reception area. Further, the protruding bars 30 define a reception area for casting material for casting of the ferrite bars 17 and the winding structure 12. Further, the protruding bars 30 increase a mechanical stability of the base element 3.

The protruding bars 30 are arranged in the center region of the base element 3, in particular, in the region in between the volume above the magnetic shielding elements 13a, 13b.

Further shown are cylindrical protrusions 31 from upper surface of the cover element 3. These protrusions 31 are arranged in reception areas for ferrite bars 17. For the ease of illustration, only two cylindrical protrusions 31 are referenced with the reference numeral. These cylindrical protrusions serve as spacer element in order to provide a desired distance between the upper surface of the base element 3 and a bottom surface of a ferrite bar 17.

Figure 6:
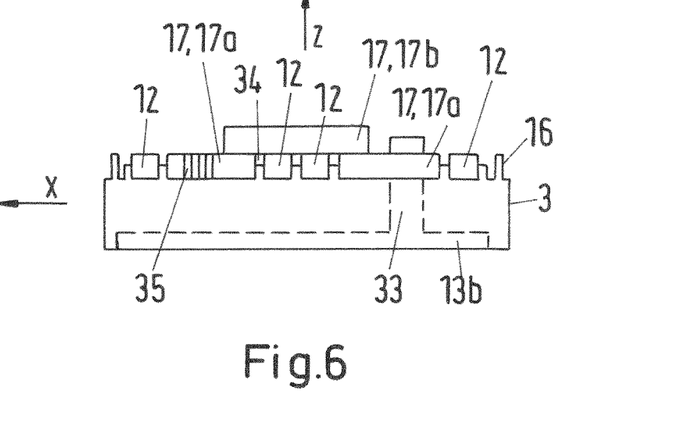

Further shown is a strap 32 which electrically connects the first magnetic shielding element 13a to the cover element 2. Further indicated is a strap 33 which electrically connects the second magnetic shielding element 13b to the cover element 2. The strap 33 can be part of or provided by the second magnetic shielding element 13b FIG. 6 shows a schematic longitudinal section of the base element 3. Shown is the tongue 16 of the tongue and groove connection between the base element 3 and the cover element 2. Further indicated is the second magnetic shielding element 13b with the strap 33.

Further shown is the winding structure 12, wherein the winding structure 12 is provided by a previously explained Double-D-winding structure. Further shown are ferrite bars 17, wherein lower ferrite bars 17a are arranged below an upper ferrite bar 17b. The arrangement of ferrite bars 17a, 17b provides a recess 34 for receiving a central section of the winding structure 12. Not shown is a casting material for ferrite bars 17a, 17b and the winding structure 12.

Further shown is an antenna element 35 which is provided by an antenna winding structure which is wound around one of the lower ferrite bars 17a. This antenna element 35 can be used for establishing a wireless signal connection between the components of the first circuit board 10a and a primary unit.

Figure 7:
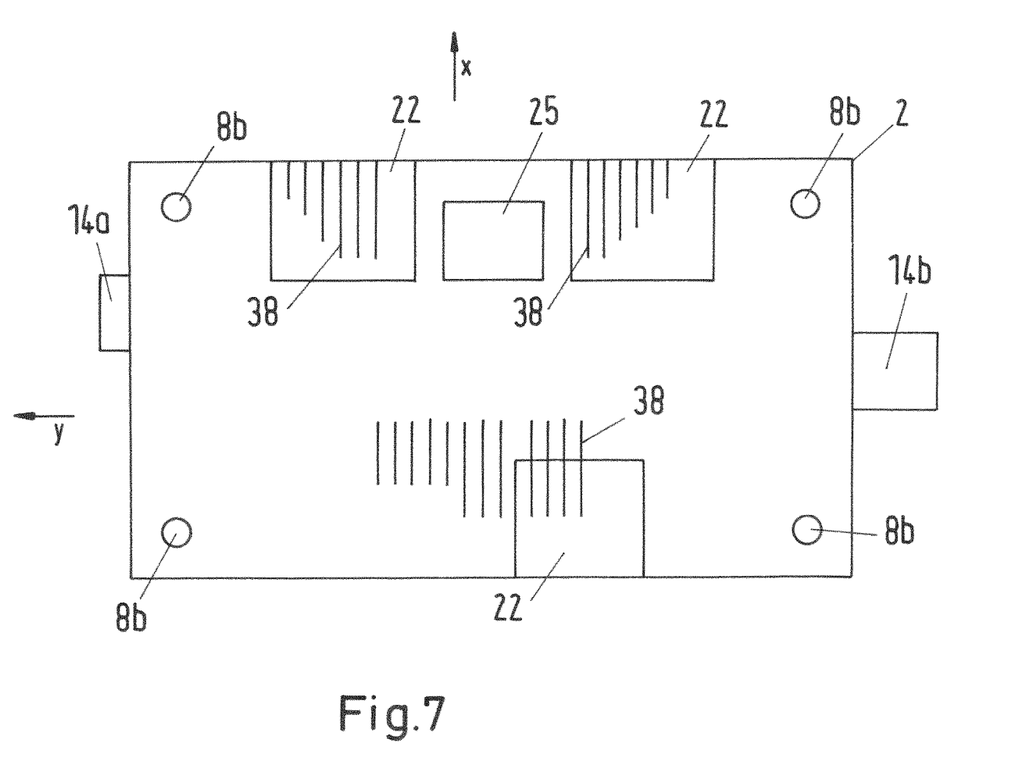

FIG. 7 shows a schematic top view on a cover element 2 in another embodiment. Unlike the embodiment shown in FIG. 3, cooling fins 38 are arranged on the cover element 2, wherein the cooling fins 38 extend from a top side of the cover element 2. It is shown that at least a part of the cooling fins 38 is arranged in recesses 22 in the top side of the cover element 2. In some non-limiting embodiments, cooling fins 38 may be arranged completely in or outside the recesses 22 on the top side of the cover elements 2. Further shown is the second membrane element 25 which has been described in the embodiment shown in FIG. 3 as well as through-holes 8b for receiving screws to mount the receiving device 1, in particular the cover element 2 to the vehicle.

Figure 8:
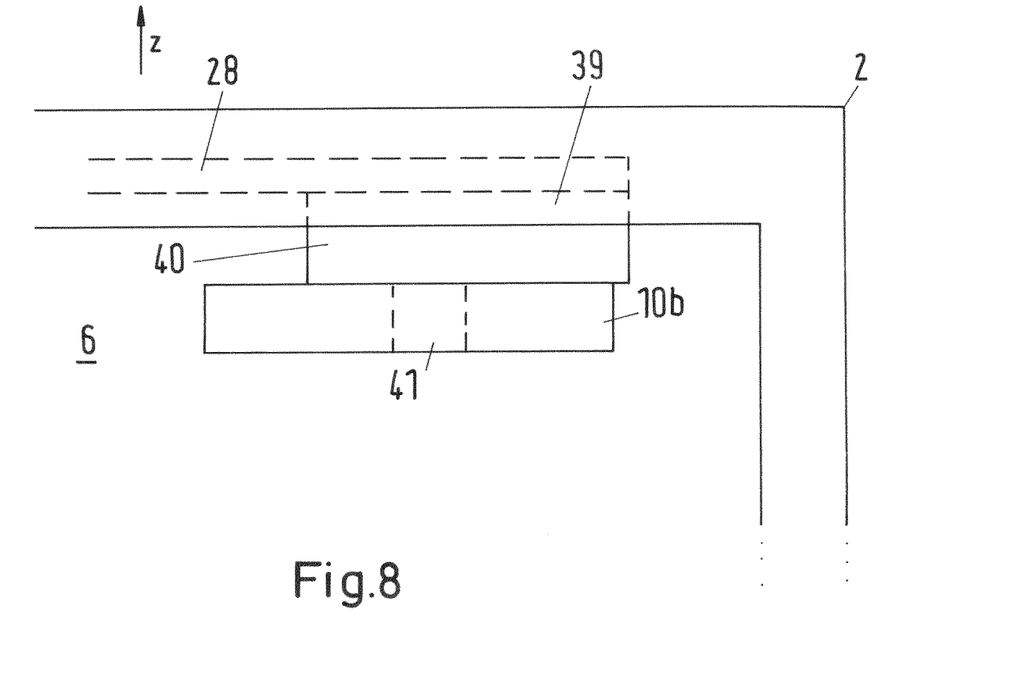

FIG. 8 shows a detailed view of a schematic cross-section of a cover element 2 in another embodiment. Shown is a heat pipe 28 which is arranged in a reception nut of the cover element 2. Further shown is a copper plate 39, which is also arranged in a recess in an inner wall section of the cover element 2. The copper plate 39 is mechanically connected to the heat pipe 28, in particular to an end section of the heat pipe 28. In particular, the mechanical connection can be provided by a solder connection. Thus, a thermal connection is provided between the copper plate 39 and the heat pipe 28. Further shown is another thermal pad 40 which comprises aluminum nitrite or consists of aluminum nitrite. The further thermal pad 40 lies on a bottom side of the copper plate 3. Between the further thermal pad 40 and the copper plate 39, a thermal paste can be arranged. Thus, the further thermal pad 40 lies on a surface of the copper plate 39 which is arranged on the opposite side of the copper plate 39 which is connected to the heat pipe 28. The further circuit board 10b lies on a bottom side of a further thermal pad 40. Between the further thermal pad 40 and the further circuit board 10b, a thermal paste can be arranged. Between the bottom side of the further thermal pad 40 and the top side of the further circuit board 10b, a thermal paste can be arranged. Further schematically shown is a thermal vias 41 by which electronic elements, in particular heat generating elements on the bottom side of the further circuit board 10b can be thermally connected to the further thermal pad 40.

A thickness of the further circuit board 10b can be within the range of 1.2 mm to 1.4 mm. A thickness of the further thermal pad 40 can be within the range of 0.4 mm to 0.6 mm. A thickness of the copper plate 39 can be in the range of 0.9 mm to 1.1 mm. A thickness of a layer of thermal paste can be in the range of 0.05 mm to 0.15 mm.

Figure 9A:
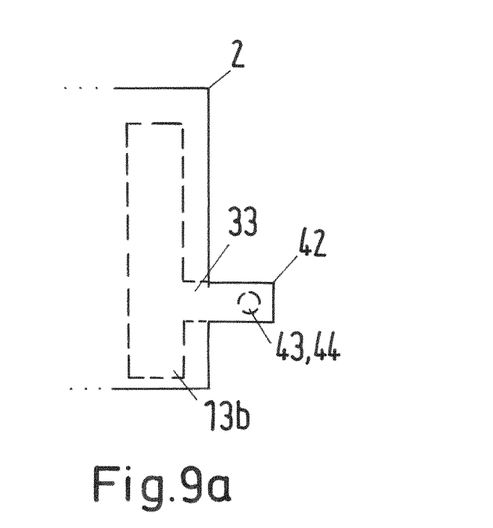
FIG. 9a a schematic top view on the cover element.

In FIG. 9a, a schematic top view on the cover element is shown. It is shown that the cover element 2 has a projecting portion 42 or provides such a projecting portion, wherein the projecting portion 42 can extend from an edge region, in particular a lateral edge region, of the cover element 2. Further shown is the second magnetic shielding element 13b has or provides a strap 33. Within the strap 33, a through-hole 43 can be arranged. In the projecting portion 42 of the cover element 2, a thread section 44 can be arranged. In some non-limiting embodiments, the strap 33 of the second magnetic shielding element 13b may be connected by a screw to the cover element 2 and to provide an electrical and mechanical connection, wherein the screw extends through the through-hole 43 of the strap 33 into the thread section 44.

Figure 9B:
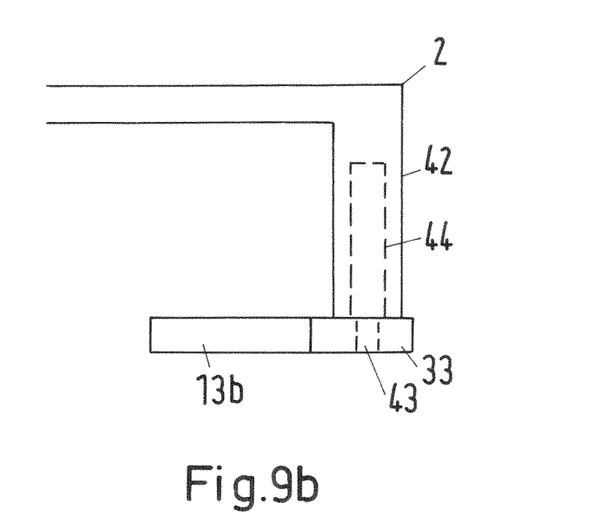
FIG. 9b a detailed schematic cross-section of the cover element with the second magnetic shielding element.

FIG. 9b shows a detailed schematic cross-section of the cover element 2 with the second magnetic shielding element 13b. In particular shown are the strap 33 of the second magnetic shielding element 13b, the through-hole 43 within the strap 33 as well as the thread section 44 in the projecting section 42 of the cover element 2.

The first magnetic shielding element 13a (see e. g. FIG. 1) can be connected to the cover element 2 in a similar manner.

REFERENCE LIST

1 receiving device
2 cover element
3 base element
4 through-hole
5 thread section
6 inner volume
7 side walls
8a through-hole
8b through-hole
9a, 9b reception area
10a, 10b circuit board
11 screw
12 winding structure
13a, 13b magnetic shielding element
14a, 14b connector
15 groove
16 tongue
17 ferrite bar
17a, 17b ferrite bar
18 thermal pad
19 cylindrical protrusion
20 cone-shaped protrusion
21 cooling pin
22 recess
23 first membrane element
24 groove
25 second membrane element
26 groove
27 thread section
28 heat pipe
29 through-hole
30 bar
31 cylindrical protrusion
32 strap
33 strap
34 recess
35 antenna element
36 flat ribbon cable
37 reception slot
38 cooling fin
39 copper plate
40 further thermal pad
41 thermal vias
42 projecting section
43 through hole
44 thread section

The invention claimed is:

1. A receiving device of a system for inductive power transfer, wherein the receiving device comprises:
   a housing, wherein the housing comprises:
      a cover element, and
      a base element;
   at least one reception area on the cover element for receiving a circuit board;
   at least one magnetic shielding element, wherein the at least one magnetic shielding element covers the at least one reception area at least partially; and
   a winding structure;
   wherein, in a mounted state in which the receiving device is mounted on a vehicle, the cover element is arranged above the base element,
   wherein the magnetic shielding element is arranged below the at least one reception area and the winding structure with respect to a vertical axis of the receiving device, and
   wherein the vertical axis of the receiving device is oriented orthogonal to an upper surface of the cover element and a bottom surface of the base element.

2. The receiving device according to claim 1, wherein a circuit board is arranged in the reception area, wherein the magnetic shielding element fully covers the circuit board from below.

3. The receiving device according to claim 1, wherein the magnetic shielding element has or provides at least one strap, wherein the at least one strap contacts the cover element.

4. The receiving device according to claim 3, wherein the at least one strap extends into or through a sidewall of the housing.

5. The receiving device according to claim 1, wherein a contour of the magnetic shielding element fully encloses a contour of the circuit board or encloses the contour of the circuit board by more than a predetermined non-zero percentage but not fully in a common plane of projection.

6. The receiving device according to claim 1, wherein the magnetic shielding element has at least one recess, wherein the at least one recess is provided by a concave section of a contour of the magnetic shielding element.

7. The receiving device according to claim 1, wherein the cover element comprises a first reception area and at least one further reception area, wherein a first circuit board is arranged in the first reception area and a further circuit board is arranged in the further reception area, wherein the receiving device comprises at least one connecting means for providing a signal connection between the first and the further circuit board, wherein at least one section of the signal connecting means is arranged in a guiding channel of the cover element.

8. The receiving device according to claim 1, wherein the magnetic shielding element is oriented orthogonal to a main direction of the field lines of the electromagnetic field receivable by the winding structure.

9. The receiving device according to claim 1, wherein the magnetic shielding element is made of aluminium.

10. The receiving device according to claim 1, wherein a thickness of the magnetic shielding element depends on a frequency of the electromagnetic field receivable by the winding structure.

11. The receiving device according to claim 1, wherein the magnetic shielding element is attached to the bottom element.

12. The receiving device according to claim 1, wherein the cover element has at least one alignment projection for aligning the circuit board.

13. The receiving device according to claim 12, wherein the alignment projection has a thread.

14. A method of manufacturing a receiving device of a system for inductive power transfer, wherein a cover element and a base element of a housing of the receiving device are provided, wherein the cover element has at least one reception area, wherein at least one magnetic shielding element is provided, wherein the at least one magnetic shielding element is arranged in the housing such that it covers the at least one reception area of the cover element at least partially, wherein the receiving device comprises a winding structure, wherein, in a mounted state in which the receiving device is mounted on a vehicle, the cover element is arranged above the base element, wherein the magnetic shielding element is arranged below the reception area and the winding structure with respect to a vertical axis of the receiving device, and wherein the vertical axis of the receiving device is oriented orthogonal to an upper surface of the cover element and a bottom surface of the base element.

* * * * *